(12) United States Patent
Jain et al.

(10) Patent No.: US 9,449,676 B2
(45) Date of Patent: *Sep. 20, 2016

(54) DRIVER CIRCUIT

(71) Applicant: Rambus Inc., Sunnyvale, CA (US)

(72) Inventors: Manish Jain, Bangalore (IN); Navin Kumar Mishra, Bangalore (IN)

(73) Assignee: Rambus Inc., Sunnyvale, CA (US)

( * ) Notice: Subject to any disclaimer, the term of this patent is extended or adjusted under 35 U.S.C. 154(b) by 0 days.

This patent is subject to a terminal disclaimer.

(21) Appl. No.: 14/574,126

(22) Filed: Dec. 17, 2014

(65) Prior Publication Data

US 2015/0103607 A1 Apr. 16, 2015

Related U.S. Application Data

(63) Continuation of application No. 13/440,663, filed on Apr. 5, 2012, now Pat. No. 8,929,159.

(60) Provisional application No. 61/472,496, filed on Apr. 6, 2011.

(51) Int. Cl.
| | | |
|---|---|---|
| G11C 7/00 | (2006.01) | |
| G11C 11/4094 | (2006.01) | |
| H03L 7/00 | (2006.01) | |
| G11C 11/4076 | (2006.01) | |
| G06F 13/40 | (2006.01) | |

(52) U.S. Cl.
CPC ....... *G11C 11/4094* (2013.01); *G06F 13/4072* (2013.01); *G11C 7/00* (2013.01); *G11C 11/4076* (2013.01); *H03L 7/00* (2013.01)

(58) Field of Classification Search
CPC ............ G11C 8/08; G11C 5/145; G11C 7/12
USPC ............... 365/189.11, 189.05, 233.1, 233.12
See application file for complete search history.

(56) References Cited

U.S. PATENT DOCUMENTS

| | | | |
|---|---|---|---|
| 7,339,409 B2 | 3/2008 | Choi et al. | |
| 7,417,479 B2 | 8/2008 | Kitayama | |
| 7,463,052 B2 | 12/2008 | Blodgett et al. | |
| 7,466,184 B2 | 12/2008 | Ricard et al. | |
| 7,511,554 B2 | 3/2009 | Kaneko et al. | |
| 7,764,554 B2 | 7/2010 | Kwon | |
| 8,929,159 B2* | 1/2015 | Jain .......................... | G11C 7/00 |
| | | | 365/189.05 |
| 2009/0279369 A1* | 11/2009 | Song .................... | G11C 7/1051 |
| | | | 365/189.15 |
| 2010/0007399 A1 | 1/2010 | Taki | |
| 2010/0026344 A1 | 2/2010 | Bringivijayaraghavan et al. | |

\* cited by examiner

*Primary Examiner* — Son Dinh
(74) *Attorney, Agent, or Firm* — Lance Kreisman; Peninsula Patent Group

(57) ABSTRACT

A method of operation in a memory controller includes operating pull-up and pull-down drivers driven by separate pre-drivers between different voltage rails. Data signals driving the pull-up driver and the pull-down driver are synchronized, and the pull-up driver and the pull-down driver are coupled together to produce an output signal having a voltage swing based on both the pull-up driver and the pull-down driver.

20 Claims, 5 Drawing Sheets

FIGS. 2a-d

DRIVER CIRCUIT

CROSS REFERENCE TO RELATED APPLICATIONS

This application is a Continuation of U.S. patent application Ser. No. 13/440,663, filed Apr. 5, 2012, titled DRIVER CIRCUIT, and which claims the benefit of priority under 35 U.S.C. 119(e) to Provisional Application Ser. No. 61/472,496, filed Apr. 6, 2011, titled DRIVER CIRCUIT, both of which are incorporated herein by reference in their entirety.

BACKGROUND

Transmitting data at high speeds between a dynamic random access memory (DRAM) device and a memory controller requires careful design of input/output (I/O) drivers to ensure that signaling rates are maximized. The circuit components used in such drivers typically have greater oxide thicknesses than core devices, and thus have greater impedances. The higher impedances in turn can limit the maximum signaling rate of these I/O drivers. In addition, device mismatches, variations in process, voltage, and temperature of the I/O driver circuitry can also further limit maximum signaling rates.

BRIEF DESCRIPTION OF DRAWINGS

The embodiments of the invention will be described in detail in the following description with reference to the following figures.

DETAILED DESCRIPTION OF EMBODIMENTS

Figure 1:
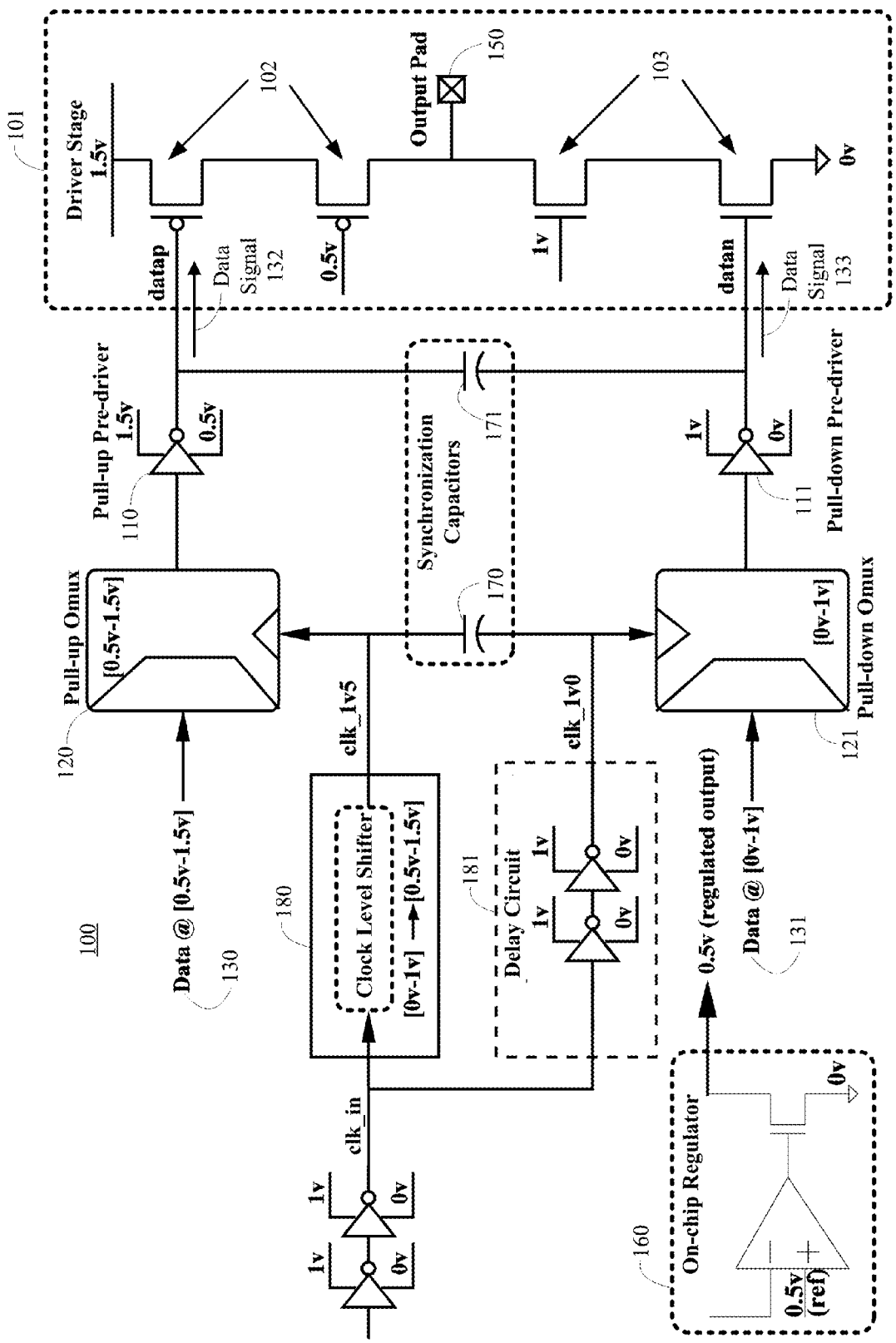
FIG. 1 illustrates a driver circuit, according to an embodiment.

For simplicity and illustrative purposes, the principles of the embodiments are described by referring mainly to examples thereof. In the following description, numerous specific details are set forth in order to provide a thorough understanding of the embodiments. It will be apparent however, to one of ordinary skill in the art, that the embodiments may be practiced without limitation to these specific details. Also, the embodiments may be used together in various combinations. In some instances, well known methods and structures have not been described in detail so as not to unnecessarily obscure the description of the embodiments.

1. Overview

According to an embodiment, a driver circuit includes pull-up and pull-down drivers driven by separate pre-drivers operating between different voltage rails. The pull-up and pull-down drivers receive the same data carried by synchronized data signals from the pre-drivers. A capacitor is coupled between the output nodes of the pre-drivers to minimize skew between the synchronized data signals. Also, synchronized clock signals drive data circuits providing the synchronized data signals to the pre-drivers. A capacitor is used to minimize skew between the clock signals.

The driver circuit, in one example, is for a double date rate (DDR) memory system outputting data at both the rising edge and the falling edge of the clock. The driver circuit is comprised of core devices, which have a thinner oxide thickness than typical I/O devices. The thinner oxide thickness minimizes impedance and maximizes the signaling rate at the output of the driver circuit. A core device is a semiconductor circuit that utilizes signaling levels having a voltage swing range at or below a core swing range. For example, the voltage swing range may be between 0 v and 1 v. Typical I/O devices, on the other hand, may have a larger voltage swing range, such as 0 v to 1.5 v. The core devices may include MOSFETs, including NMOS and PMOS.

The driver circuit uses two sets of rails to provide high-voltage output (Voh) and low-voltage output (Vol) levels. One set of rails includes 0 v and 1 v rails and the other set includes 0.5 v and 1.5 v rails. The pull-up pre-driver, for example, operates using the 0.5 v and 1.5 v rails, and the pull-down pre-driver, for example, operates using the 0 v and 1 v rails. The two sets of voltage rails are described by way of example as being 0 v and 1 v rails and 0.5 v and 1.5 v rails. Other Voh and Vol levels may be used for each set, however, the Voh and Vol levels for each set may be different. The driver circuit may also include an on-chip regulator that supplies power for the 0.5 v rail. Constructed in this manner, the driver circuit may employ circuitry associated with each set of rails that operates with a voltage swing range consistent with core devices, that is, within a 1.0 volt swing range in this example.

The driver circuit includes a clock level shifter to provide a clock signal, for example, between 0.5 v and 1.5 v to accommodate components operating using the 0.5 v and 1.5 v rails. The clock level shifter includes a circuit that minimizes duty cycle error that can cause signal rate reduction. For example, the clock level shifter includes alternating current (AC) coupled capacitors and trip-point biased inverters to shift the voltage level of the clock. The driver circuit is described in further detail below.

By suitably combining two sets of circuits, each operating with a voltage swing range consistent with core devices, I/O drivers may be constructed that have low impedance and other characteristics associated with high speed single ended or differential signaling, but in a manner that does not require the relatively greater oxide thicknesses often needed for these elements.

2. Driver Circuit

Figure 4:
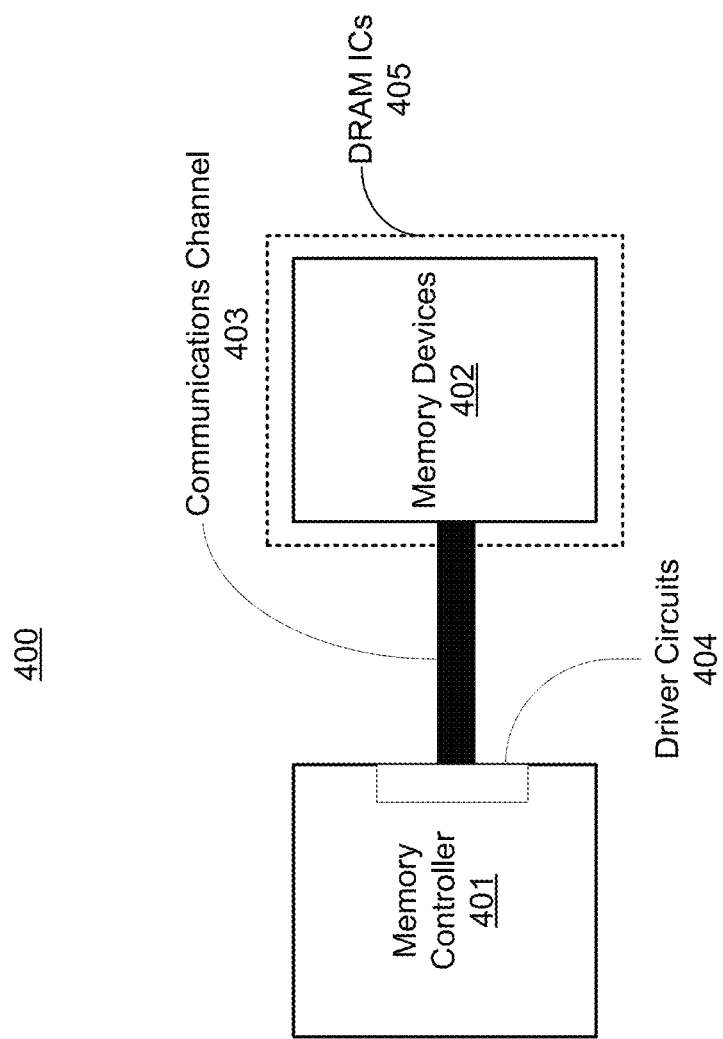
FIG. 4 illustrates the driver circuit used to output data to memory devices over a bus, according to an embodiment.

FIG. 1 illustrates a driver circuit 100, according to an embodiment. The driver circuit 100 may be an I/O driver that outputs data over a communication channel. In one example, the driver circuit may be provided in a memory controller and outputs data to memory devices via a bus, such as shown in FIG. 4 and described in detail below. The driver circuit 100 may be provided in other types of signaling interfaces.

The driver circuit 100 includes pull-up driver 102 and pull-down driver 103 in driver stage 101 driven by pull-up pre-driver 110 and pull-down pre-driver 111, respectively. Data circuits 120 and 121 output the same data carried by two different synchronized data signals to the pull-up pre-driver 110 and the pull-down pre-driver 111, respectively. For example, the data circuit 120 is an output multiplexer (i.e., pull-up Omux 120) driven by the clock signal clk_1v5. As is further described below, the clock signal clk_1v5 is a level-shifted clock signal oscillating between 0.5 v and 1.5 v. The data circuit 121, for example, is an output multiplexer (i.e., pull-down Omux 121) driven by the clock signal clk_1v0 oscillating between 0 v and 1 v. The clock signals clk_1v5 and clk_1v0 are synchronized using a capacitor. The pull-up and pull-down Omuxs 120 and 121 receive two data signals 130 and 131 carrying the same data, except the data signal 130 has signaling levels of 0.5 v and 1.5 v and data signal 131 has signaling levels of 0 v and 1v. The pull-up and pull-down Omuxs 120 and 121 are driven by the synchronized clock signals clk_1v5 and clk_1v0, respectively, so that the pull-up and pull-down Omuxs 120 and 121 output synchronized data signals carrying the same data, except the data signal output to the pull-up pre-driver 110 has signaling levels of 0.5 v and 1.5 v and the data signal output to the pull-down pre-driver 111 has signaling levels of 0 v and 1 v.

The pull-up pre-driver 110 and the pull-down pre-driver 111 output the synchronized data signals to the pull-up driver 102 and the pull-down driver 103, respectively. The pre-drivers 110 and 111 may condition the data signals. Signal conditioning may include conditioning the data signals to be within voltage tolerances for output to the drivers 102 and 103. The data carried by the synchronized data signals is then output by the pull-up driver 102 and the pull-down driver 103 via the output pad 150. Thus, the same data is provided to the pre-drivers 110 and 111 and drivers 102 and 103 using two different paths.

The pull-up and pull-down Omuxs 120 and 121 may output data at a double data rate, such as on a rising edge and a falling edge of synchronized clock signals clk_1v5 and clk_1v0 driving the data circuits 110 and 111 respectively. The pull-up pre-driver 110 and the pull-down pre-driver 111 may modify the data signals before the data signals are sent to the pull-up driver 102 and the pull-down driver 103. The pull-up pre-driver 110 and the pull-down pre-driver 111 may create same polarity output data signals 132 and 133 close to the low and high signaling levels for use by the pull-up driver 102 and the pull-down driver 103.

At output pad 150, the low output level is referred to as Vol and the high output level is referred to as Voh The pull-up driver 102 and the pull-down driver 103 receive the same data carried by the two synchronized data signals 132 and 133 via the datap node and the datan node, respectively. For example, the pull-up driver 102 is a pmos circuit and the pull-down driver 103 is an nmos circuit. If both the datap node and the datan node receive a low signaling level in the data signals 132 and 133, the pull-up driver 102 conducts (i.e., on), the pull-down driver 103 does not conduct (i.e., off) and the output pad 150 outputs a Voh signal. If both the datap node and the datan node receive a high signaling level in the data signals 132 and 133, the pull-up driver 102 is off, the pull-down driver 103 is on and the output pad 150 is pulled to Vol and outputs a Vol data signal. Thus, the same data is provided to the driver stage 101. This includes providing data of the same polarity, such as low or high, at the same time on the datap and the datan nodes. The data provided to the driver stage 101 is carried by two synchronized data signals on two different paths. The data is output from the driver stage 101 on the output pad 150.

The driver circuit 100 includes two different sets of voltage rails. For example, one set of voltage rails include a 0.5 v rail and a 1.5 v rail, and the other set includes a 0 v rail and a 1 v rail. The pull-up pre-driver 110 operate with one set of rails, and the pull-down pre-driver 111 operate with the other set of rails. For example, the pull-up pre-driver 110 operate with the 0.5 v rail and the 1.5 v rail, and the pull-down pre-driver 111 operate with the 0 v rail and the 1 v rail. In another example, the driver circuit 101 may be designed so that the pull-up pre-driver 110 operate with the 0.5 v rail and the 1.5 v rail, and the pull-down pre-driver 111 operate with the 0 v rail and the 1 v rail. A regulator 160, which may be an on-chip regulator, may be used to provide power supply for the 0.5 v rail and for any nodes using 0.5 v.

3. Synchronization Capacitors

Synchronization capacitor 170, for example, is coupled between the clock input nodes of the Omuxs 120 and 121. Synchronization capacitor 171, for example, is coupled between the data input nodes, datap and datan, of the drivers 102 and 103. The synchronization capacitor 170 minimizes skew between the synchronized clock signals clk_1v5 and clk_1v0, and the synchronization capacitor 171 minimizes skew between the synchronized data signals 132 and 133. Skew may be caused by device mismatch, variations in process, voltage and temperature, or other factors. The skew can cause reduced signaling rates at the output pad 150.

The synchronization capacitors 170 and 171 minimize the skew because the synchronized clock signals clk_1v5 and clk_1v0 and the synchronized data signals 132 and 133 carry the same data and hence move in the same direction. This is further described with respect to FIGS. 2a-d.

Figure 2:
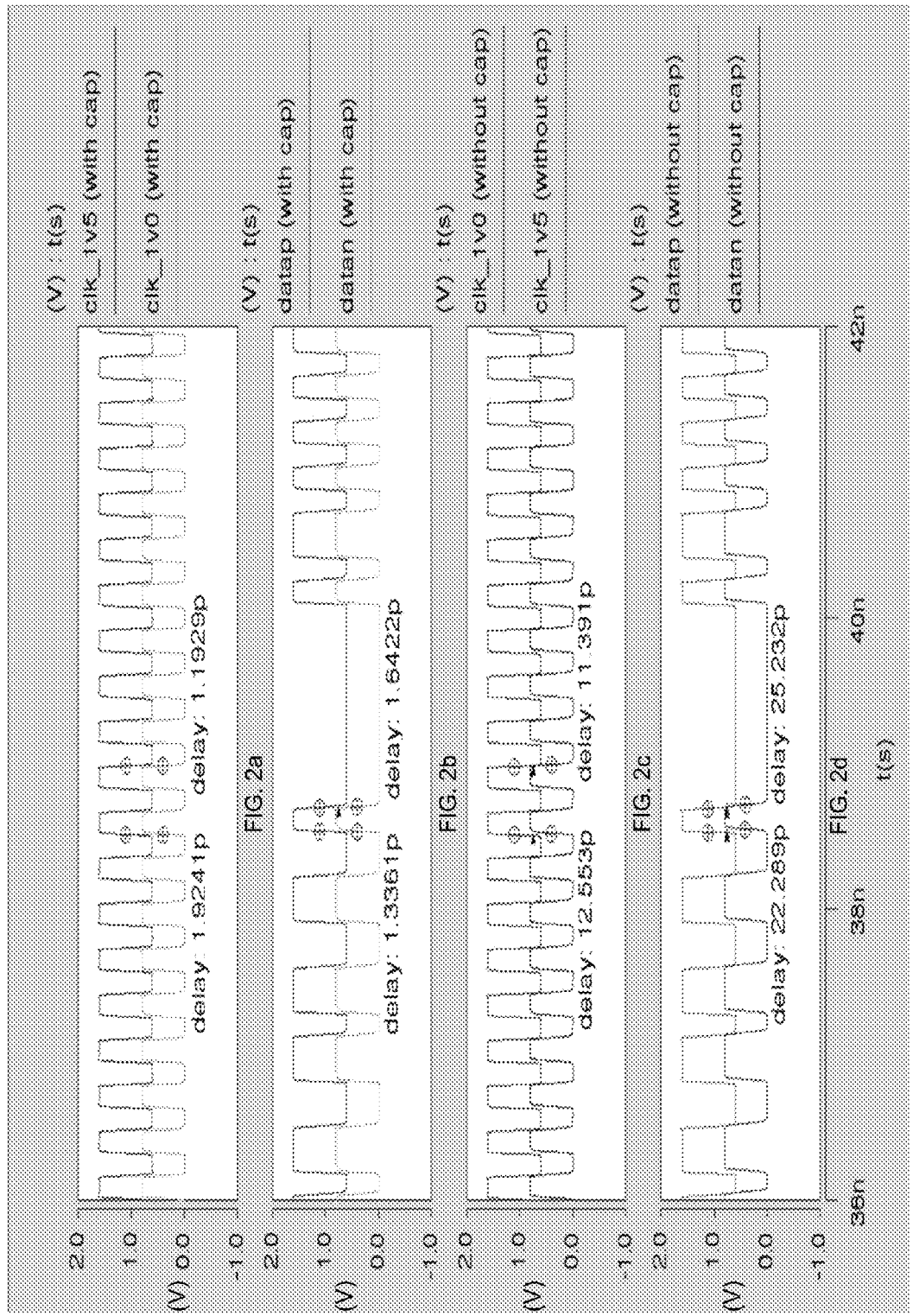
FIGS. 2a-d illustrate timing diagrams, according to an embodiment.

The driver circuit 100 was tested with the synchronization capacitors 170 and 171 and without the synchronization capacitors 170 and 171. FIG. 2c shows the skew between clock_1v5 and clock_1v0 when the synchronization capacitor 170 is not used in the driver circuit 100. On the rising edge, the skew between clk_1v0 and clk_1v5 is 12.553 picoseconds and on the falling edge, the skew is 11.391 picoseconds. FIG. 2a shows the skew when the synchronization capacitor 170 is used in the driver circuit 100. As can be seen in FIG. 2a, the skew is reduced to 1.9241 picoseconds on the rising edge and 1.1929 picoseconds on the falling edge.

FIG. 2d shows the skew between the data signal 132 received at the datap node and the data signal 133 received at the datan node when the synchronization capacitor 171 is not used. The skew is 22.289 picoseconds on the rising edge and 25.232 picoseconds on the falling edge. FIG. 2b shows the skew when the synchronization capacitor 171 is used. As can be seen in FIG. 2b, the skew is reduced to 1.3361 picoseconds on the rising edge and 1.6422 picoseconds on the falling edge.

By placing the capacitors 170 and 171 between the nodes of two paths which are toggling in the same direction, the capacitors help synchronize the two paths. As shown in FIG. 1, the synchronization capacitors 170 and 171 are placed between the clock input nodes for clk_1v5 and clk_1v0 and between the datap and datan nodes, respectively. Since these nodes toggle in same direction, no current is delivered to the synchronization capacitor 170 or 171 if the signals are matched. If there is mismatch in the paths then the synchronization capacitor 170 or 171 delays the faster signal and speeds up the slower signal. The capacitors 170 and 171 cause an averaging effect resulting in synchronization of transitions. Power may be used to correct skew but if there is no mismatch then no additional power is required.

In addition to showing how skew is minimized by use of the synchronization capacitors 170 and 171, FIGS. 2a-d also show the different signaling levels used for the clock and the data signals. FIGS. 2a and 2c show clk_1v5 oscillates between 0.5 v and 1.5 v and clk_1v0 oscillates between 0 v and 1 v. FIGS. 2b and 2d show the data signal 132 between 0.5 v and 1.5 v and the data signal 133 between 0 v and 1 v.

FIGS. 2a-d also show the clock and data signals are synchronized. The clock signals clk_1v0 and clk_1v5 have the same signaling level at substantially the same time, and the data signals 132 and 133 have the same signaling level at substantially the same time, except for skew which is minimized by the synchronization capacitors 170 and 171.

4. Clock Level Shifter

FIG. 1 shows the data circuit 120 is driven by clk_1v5 oscillating between 0.5 v and 1.5 v. However, as shown in FIG. 1, the clock signal received by the data circuit 121, shown as clk_in, oscillates between 0v and 1v. Clock level shifter 180 shifts clk_in from 0 v-1 v to 0.5 v-1.5 v to create clk_1v5. A delay circuit 181 is provided to match the delay of the clock level shifter 180 so clk_1v0 and clk_1v5 are synchronized. The delay circuit 181, for example, may include inverters to match the delay of the clock level shifter 180.

Figure 3:
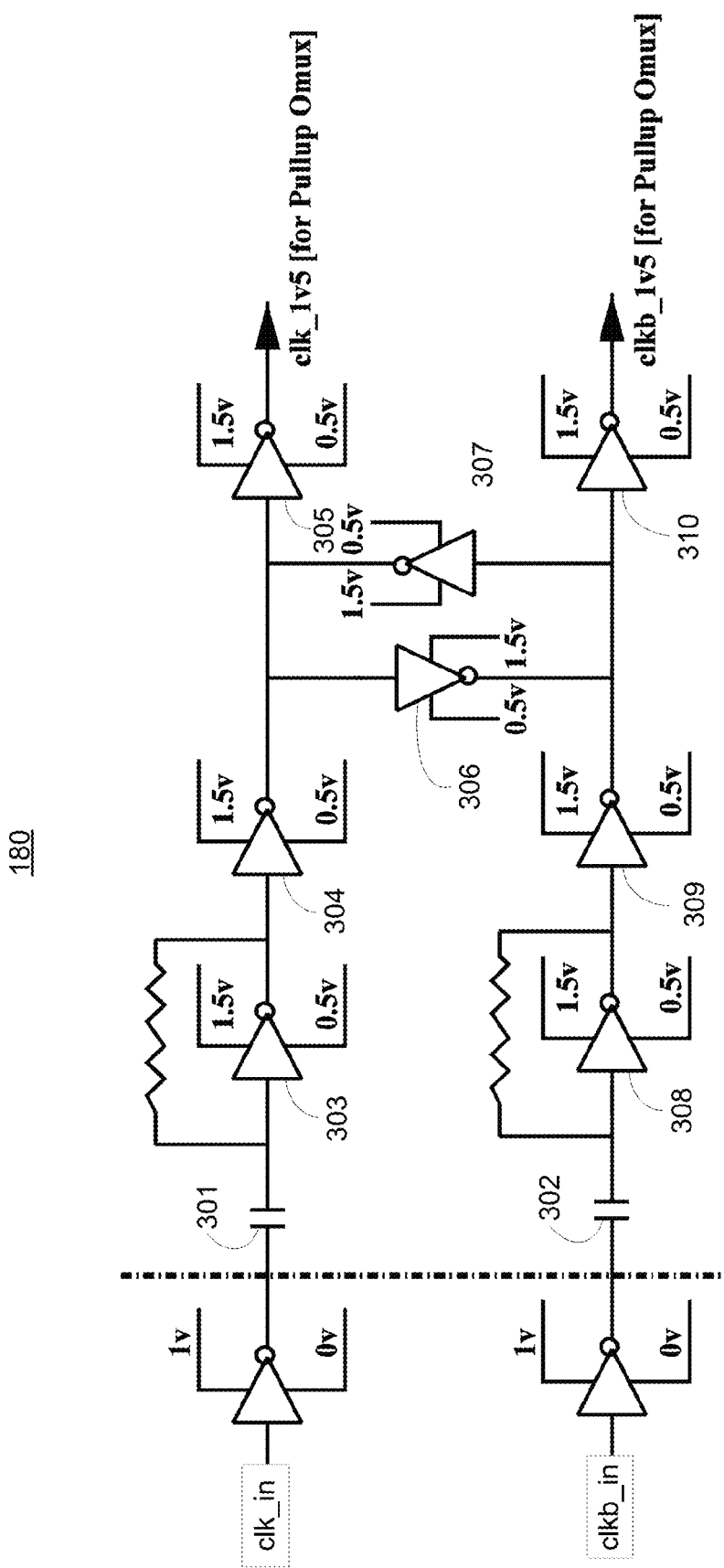
FIG. 3 illustrates a clock level shifter, according to an embodiment.

An embodiment of the clock level shifter 180 is shown in FIG. 3. Any duty cycle error introduced by clock level shifter 180 increases skew between the clk_1v0 and clk_1v5 and can result in lower data rates for data output from the data circuit 100. The clock level shifter 180 shown in FIG. 3 reduces duty cycle error. The clock level shifter 180 includes alternating current (AC) coupled capacitors 301 and 302 and trip point biased inverters 303 and 308 to shift the voltage level of clk_in.

The capacitors 301 and 302 are referred to as AC coupled capacitors because the capacitors 301 and 302 pass the clock transitions of clk_in and filter the direct current (DC) components of the clk_in. The inverters 304-307 and 309-310 correct the duty cycle by sharpening the clock edges and clk_1v5 is output by the clock level shifter 180.

5. Driver Circuit for Memory System

FIG. 4 shows a system 400 having an I/O driver implemented in a memory controller 401. The memory controller 401 sends and receives data from memory devices 402 via a communication channel 403, such as a bus comprised of traces. The memory controller 401 includes driver circuits 404 providing data to the memory devices 402. The driver circuits 404 may each include an instance of the driver circuit shown in FIG. 1. For example, a driver circuit in the memory controller 401 outputs data carried by the data signals 132 and 133 shown in FIG. 1 to a memory device via the communication channel 403. The memory devices 402 may be dual in-line memory modules (DIMMs). For example, the memory devices 402 may be integrated circuits (ICs), such as DRAM ICs 405. The dashed box labeled memory DRAM ICs 405 represents that the memory devices 402 may optionally be instantiated as DRAM ICs. The system 400 may be a DDR memory system, and the memory controller 401 may be provided on a chip, such as a processor chip. In one example, the memory system 400 is a graphics double data rate (GDDR) memory system using DDR memory devices. The GDDR memory system may be a GDDR5 memory system including DDR3 memory devices. The driver circuits 104 enable high speed data rates used in graphics applications.

6. Method

Figure 5:
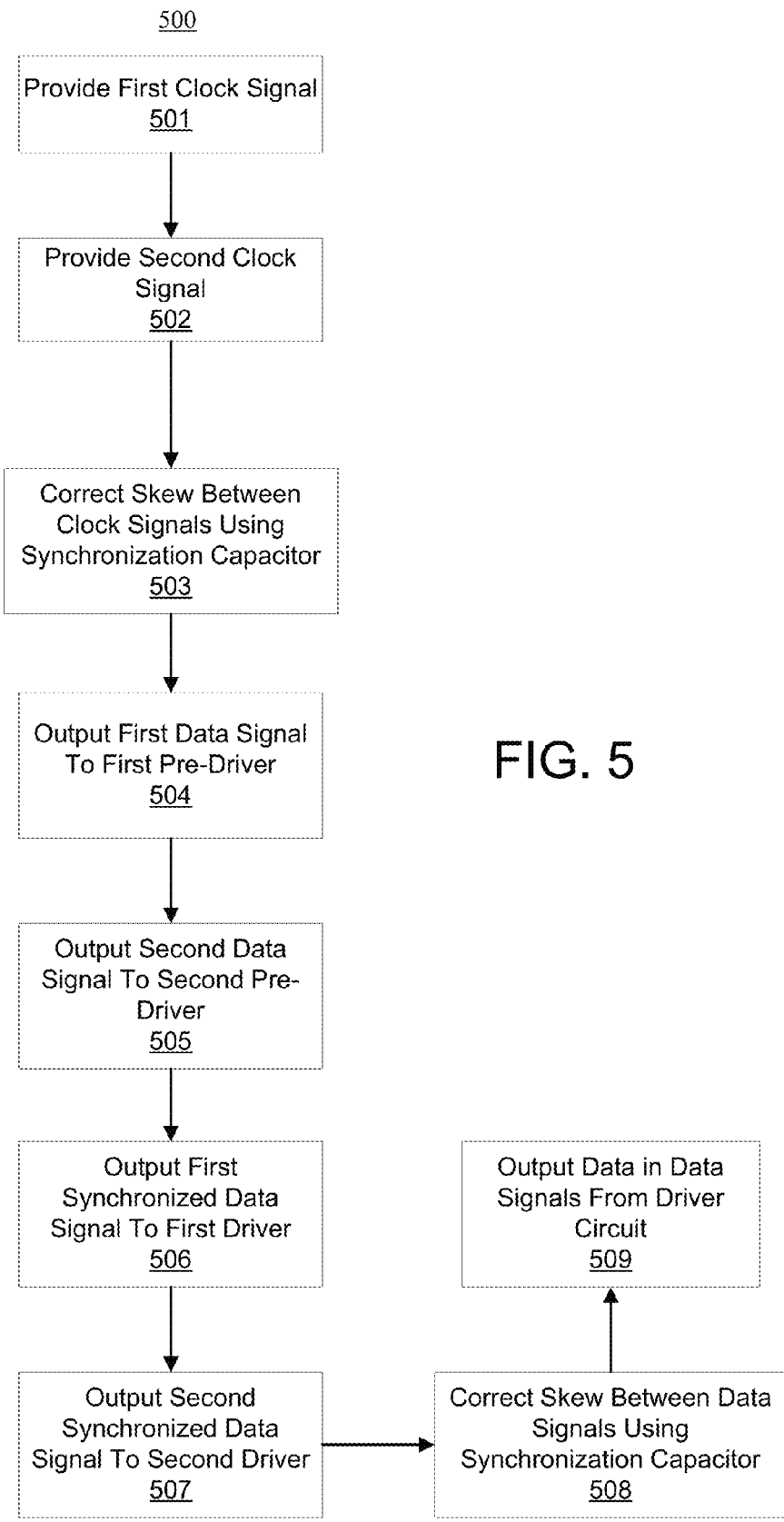
FIG. 5 illustrates a method, according to an embodiment.

FIG. 5 illustrates a method 500 for providing synchronized data signals carrying the same data to first and second drivers, according to an embodiment. The method 500 is described with respect to the driver circuit 100 shown in FIG. 1 by way of example.

At step 501, a first data circuit is provided with a first clock signal oscillating between oscillating between 0 v and 1 v. For example, the data circuit 121 receives clk_1v0.

At step 502, a second data circuit is provided with a second clock signal oscillating between 0.5 v and 1.5 v. The first and second clock signals are synchronized. For example, the data circuit 120 receives clk_1v5, and this signal is synchronized with clk_1v0.

At step 503, a synchronization capacitor, such as the synchronization capacitor 170, is used to correct skew between the synchronized clock signals clk_1v0 and clk_1v5. The synchronized clock signals are of the same frequency, except clk_1v0 is between 0 v-1 v and clk_1v5 is between 0.5 v-1.5 v such as shown in FIGS. 2a and 2c. The synchronized clock signals are received at substantially the same time at the data circuits 120 and 121. Thus, steps 501-503 are in one embodiment performed at the same time.

At step 504, a first data signal is output from the first data circuit to a first pre-driver responsive to the first clock signal. For example, the pull-down pre-driver 111 receives the data signal output by the data circuit 121.

At step 505, a second data signal is output from the second data circuit to a second pre-driver responsive to the second clock signal. For example, the pull-up pre-driver 110 receives the data signal from the data circuit 120. The first and second data signals are synchronized. The synchronized data signals carry the same data, and the same data is received at substantially the same time at the pull-up pre-driver 110 and the pull-down pre-driver 111. Thus, steps 504 and 505 are typically performed at the same time.

At step 506, the first synchronized data signal is output to the first driver from the first pre-driver. For example, the pull-down driver 103 receives the data signal 133 at the node datan from the pull-down pre-driver 111.

At step 507, the second synchronized data signal is output to the second driver from the second pre-driver. For example, the pull-up driver 102 receives the data signal 132 at the node datap from the pull-up pre-driver 110.

At step 508, a synchronization capacitor, such as the synchronization capacitor 171, is used to correct skew between the synchronized data signals 132 and 133. Steps 506-508 are performed at the same time.

At step 509, data from the synchronized data signals 132 and 133 is output from the driver circuit 100.

While the embodiments have been described with reference to examples, those skilled in the art will be able to make various modifications to the described embodiments without departing from the scope of the claimed embodiments.

What is claimed is:

1. A method of operation in a memory controller, the method comprising:
   operating a pull-up driver within a first voltage swing range;
   operating a pull-down driver within a second voltage swing range that is not coterminal with the first voltage swing range,
   synchronizing data signals driving the pull-up driver and the pull-down driver, and producing an output signal having a voltage swing based on a coupled configuration of the pull-up driver and the pull-down driver.

2. The method of claim 1, further comprising:
   providing the data signals on different paths to the pull-up driver and the pull-down driver.

3. The method of claim 2, further comprising:
   providing the same data as the data signals provided on the different paths to the pull-up driver and the pull-down driver.

4. The method of claim 1, further comprising:
driving circuits with synchronized clock signals to provide the data signals to the pull-up driver and the pull-down driver.

5. The method of claim 4, wherein driving circuits with the synchronized clock signals includes operating clock signals within the first voltage swing range to drive one of the circuits providing the data signals to the pull-up driver, and operating clock signals within the second voltage swing range to drive the other circuit providing the data signals to the pull-down driver.

6. The method of claim 5, wherein driving circuits with the synchronized clock signals includes operating the clock signals within the first and second voltage swings that are derived from a clock signal operating within the first voltage swing range.

7. A method of driving signals comprising:
coupling a pull-up pre-driver to a pull-up driver;
coupling a pull-down pre-driver to a pull-down driver;
receiving a second data signal with the pull-down pre-driver;
outputting the second data signal to the pull-down driver; and
synchronizing data signals output from the pull-up and pull-down pre-drivers to the pull-up and pull-down drivers, the synchronizing carried out by a synchronization capacitor coupled to outputs of the pull-up and pull-down pre-drivers.

8. The method of claim 7, further comprising:
operating the pull-up pre-driver within a first voltage swing range and operating the pull-down pre-driver within a second voltage swing range that is not coterminal with the first voltage swing range.

9. The method of claim 8, further comprising:
providing a lower voltage of the first swing range with an on-chip regulator.

10. The method of claim 7, comprising:
receiving an input clock signal with a clock level shifter, the input clock signal oscillating within the second voltage swing range; and
outputting a clock signal oscillating within the first voltage swing range on an output node.

11. The method of claim 10, comprising:
outputting the clock signal in the first voltage swing range with the clock level shifter along a first clock signal path including the clock level shifter;
receiving the input clock signal on an input node of a delay circuit in a second clock signal path; and
outputting the input clock signal on the output node after a delay to synchronize the outputs of the delay circuit and the clock level shifter.

12. The method of claim 10, comprising:
synchronizing the outputs of the delay circuit and the clock level shifter with a second synchronization capacitor coupled between the output node of the clock level shifter and the output node of the delay circuit.

13. The method of claim 10, comprising:
outputting the data signals to the pull-up and pull-down pre-drivers with a first data circuit and a second data circuit; and
clocking each of the first and second data output circuitsby one of the synchronized clock signals output by the delay circuit or the clock level shifter.

14. The method of claim 7, further comprising:
outputting data from the synchronized data signals responsive to a rising edge and a falling edge of a clock signal.

15. A method of operating a memory controller to provided output signals on a signaling bus having plural constituent lines, the memory controller including a driver for each line, the method comprising:
operating a pull-up driver within a first voltage swing range;
operating a pull-down driver within a second voltage swing range that is not coterminal with the first voltage swing range;
synchronizing data signals driving the pull-up driver and the pull-down driver; and
producing an output signal with the pull-up driver and the pull-down driver, the output signal having a voltage swing based on both the pull-up driver and the pull-down driver.

16. The method of claim 15, further comprising:
providing the data signals on different paths to the pull-up driver and the pull-down driver.

17. The method of claim 16, further comprising:
providing the same data for the data signals provided on the different paths to the pull-up driver and the pull-down driver.

18. The memory controller of claim 17, further comprising:
driving circuits with synchronized clock signals, the circuits to provide the data signals to the pull-up driver and the pull-down driver.

19. The method of claim 18, further comprising:
operating clock signals within the first voltage swing range to drive one of the circuits providing the data signals to the pull-up driver and operating clock signals within the second voltage swing range to drive the other circuit providing the data signals to the pull-down driver.

20. The method of claim 15, further comprising:
outputting data from the synchronized data signals in response to a rising edge and a falling edge of a clock signal.

* * * * *